(12) United States Patent
Ho

(10) Patent No.: US 6,388,488 B1
(45) Date of Patent: May 14, 2002

(54) SCHMITT TRIGGER WITH HYSTERESIS AND PREVIOUS-STATE MEMORY

(75) Inventor: Franklin Sai-Wai Ho, San Carlos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/704,870

(22) Filed: Nov. 2, 2000

(51) Int. Cl.$^7$ ............................................. H03K 3/037
(52) U.S. Cl. ...................................... 327/206; 327/112
(58) Field of Search ................................. 327/108, 109, 327/111, 112, 170, 206, 205, 389; 326/26, 27, 28, 57

(56) References Cited

U.S. PATENT DOCUMENTS

| | | | |
|---|---|---|---|
| 4,301,379 A | 11/1981 | Reinert | 307/290 |
| 4,506,168 A * | 3/1985 | Uya | 327/206 |
| 4,539,489 A | 9/1985 | Vaughan | 307/290 |
| 4,733,107 A | 3/1988 | O'Shaughnessy et al. | 307/290 |
| 5,327,072 A | 7/1994 | Savignac et al. | 323/313 |
| 5,336,942 A | 8/1994 | Khayat | 307/290 |
| 5,410,189 A * | 4/1995 | Nguyen | 327/170 |
| 5,489,866 A | 2/1996 | Diba | 327/206 |
| 5,594,361 A | 1/1997 | Campbell | 326/24 |
| 5,777,944 A * | 7/1998 | Knaack et al. | 327/170 |
| 6,046,617 A | 4/2000 | Hoeld | 327/206 |

* cited by examiner

Primary Examiner—Toan Tran
(74) Attorney, Agent, or Firm—Merchant & Gould PC; John E. Whitaker

(57) ABSTRACT

Described is a level-detection circuit having hysteresis and which may be powered down without losing the last state of the circuit. The level-detection circuit includes a first detection circuit, a trip-level adjustment circuit, and a second detection circuit. The first detection circuit may be essentially an inverter, with the output signal of the inverter fed to an input of the second detection circuit. The trip-level adjustment circuit is connected to the output signal and has control connections tied to the input signal. The trip-level adjustment circuit also includes control connections tied to the output signal of the circuit. In short, the trip-level adjustment circuit is configured such that one element of the trip-level adjustment circuit is connected in parallel with one element of the inverter of the first detection circuit when the input signal moves from a one potential to another potential. In addition, the trip-level adjustment circuit may include another element connected in parallel with another element of the inverter of the first detection circuit when the input signal moves in the opposite direction, e.g. from the other potential to the one potential. Moreover, the circuit includes latching circuitry, under control of an enable signal, configured to latch a last state of the trip-level adjustment circuit during a power-down event so that the input signal to the second detection circuit will have the same state when the circuit is powered back up.

21 Claims, 3 Drawing Sheets

SCHMITT TRIGGER WITH HYSTERESIS AND PREVIOUS-STATE MEMORY

BACKGROUND OF THE INVENTION

1. Field of the Invention

The present invention relates to level-detection circuits. More particularly, the present invention relates to Schmitt triggers having hysteresis.

2. Description of Related Art

Level-detection circuits having hysteresis, often referred to as Schmitt trigger circuits or simply Schmitt triggers, are commonly used in integrated circuits for receiving signals external to the integrated circuit. The Schmitt trigger is commonly used to reduce the impact of a noisy input signal on the integrated circuit. However, existing Schmitt triggers suffer from some problems. For example, in modern electronics, there is a growing desire for components with the capability to be powered off, such as portions of notebook computers or cellular phones. In those situations, it is important that the components be in the same state when powered back on as they were when powered down. For instance, a Schmitt trigger circuit may have a different trip point depending on whether the last state of the output signal was high or low. It would be desirable to have a Schmitt trigger that can be powered down, and when powered back up, demonstrates the same voltage transfer characteristics as the state the Schmitt trigger was in at power down.

Another problem with existing Schmitt triggers involves the difficulty of achieving precise control over the hysteresis due to process variations that may occur during manufacturing of the components used in the circuit. More specifically, the different trip points (i.e., 0-to-1 and 1-to-0) of a typical Schmitt trigger are generally controlled by appropriately sizing the devices (typically, both N-type and P-type transistors) used in the circuit such that a ratio of the on-resistance of one device to another device creates a feedback that modifies the trip point of the circuit differently in each direction. However, designing a specific amount of hysteresis is difficult because slight variations in processing those components introduces significant variations in the on-resistance ratio of the specific components from the design ratio to the actual as manufactured ratio. In addition, the effects of back-bias and source voltage of transistors on the circuit can be difficult to predict. Accordingly, there is a need in the art for a Schmitt trigger that is less susceptible to process variations and which can be powered down without losing the last state.

SUMMARY OF THE INVENTION

Briefly stated, the present invention enables a level-detection circuit, such as a Schmitt trigger, having hysteresis characteristics that are less susceptible to process variations and which can be powered down without losing the last state of the circuit. More specifically, the present invention makes use of detection circuitry to detect a level of an input signal, and to modify an intermediate output signal based on the level of the input signal. The circuitry also includes trip-level adjustment circuitry to alter the voltage at which the detection circuitry changes the intermediate output signal relative to the input signal. By switching the state of the output signal based on the intermediate output signal (as influenced by the trip-level adjustment circuitry), the voltage transfer characteristics of the entire circuit may be changed thereby introducing hysteresis. In addition, latching circuitry is included in the circuit to store a last state of the circuit in the event of a power down. In that way, the circuit may be powered up in the last state, thereby displaying the same hysteresis characteristics after the circuit is powered back up.

In one aspect, the invention makes possible an apparatus for generating an output signal based on an input signal. The apparatus includes a first detection circuit configured to detect a potential of the input signal and to provide an intermediate output signal. The intermediate output signal has a level, such as a voltage potential or current, based on the input signal. The apparatus further includes a second detection circuit coupled to the intermediate output signal and configured to provide an output signal based on the level of the intermediate output signal. More specifically, as the intermediate output signal passes through a threshold potential of the second detection circuit, the second detection circuit changes state. The apparatus also includes a trip-level adjustment circuit configured to provide feedback to the first detection circuit and thereby influence the input voltage at which the level of the intermediate output signal changes. In this configuration, the trip-level adjustment circuit can cause the intermediate output signal to pass through the threshold potential of the second detection circuit when the input signal is at some potential different from the threshold potential of the first detection circuit.

In another aspect, the invention makes possible an apparatus for generating an output signal based on an input signal and that includes power-down capability. The apparatus includes a first detection circuit, coupled to receive the input signal, that detects a potential of the input signal and that provides an intermediate output signal having a level based on the potential of the input signal. The first detection circuit is also coupled to receive an enable signal that deactivates the first detection circuit in response to the enable signal being deasserted. The apparatus also includes a second detection circuit coupled to receive the intermediate output signal and to switch the output signal when the level of the intermediate output signal passes through a threshold potential of the second detection circuit. A trip-level adjustment circuit is coupled to receive the intermediate output signal from the first detection circuit and is further configured to alter the input voltage at which the intermediate output signal changes. In that way, the trip-level adjustment circuit effectively alters the threshold potential of the first detection circuit thereby altering the voltage of the input signal at which the second detection circuit changes state (i.e., hysteresis is introduced). The circuit additionally includes a latching circuit coupled to receive the intermediate output signal and to receive the enable signal. The latching circuit is configured to latch a state of the intermediate output signal in response to the enable signal being deasserted. In that way, the last state of the circuit may be recreated when the circuit is again enabled.

In yet another aspect, the invention makes possible a method for powering down a circuit that generates an output signal based on an input signal and that remember the circuit's last state at a power-down event. The method includes receiving an input signal at a level-detection circuit and generating an intermediate output signal by the level-detection circuit based on the input signal. In addition, the method includes receiving the input signal at a trip-level adjustment circuit and influencing the level-detection circuit by the trip-level adjustment circuit such that a level of the intermediate output signal changes when the input signal exceeds a first threshold, the first threshold being based upon a component in the trip-level adjustment circuit in combination with a component in the level-detection circuit. Moreover, the method includes receiving an enable signal indicating that a power-down event of the circuit is occurring. When the power-down event occurs, the intermediate output signal is in some last state. Thus, the method includes latching the last state of the intermediate output signal for the entire power-down period until a power-up event occurs.

Advantages of the present invention over existing level-detection circuits include that the hysteresis of the circuit is more easily estimated. More particularly, the hysteresis of the overall circuit can be simplified to the difference in trip points of two inverters having different transistor ratios. The trip points of inverters are easy to estimate using computer simulations, which is an improvement over existing level-detection circuits in which the hysteresis depends on various devices interacting with each other and which are not as easily computed.

DETAILED DESCRIPTION OF THE PREFERRED EMBODIMENT

Figure 1:
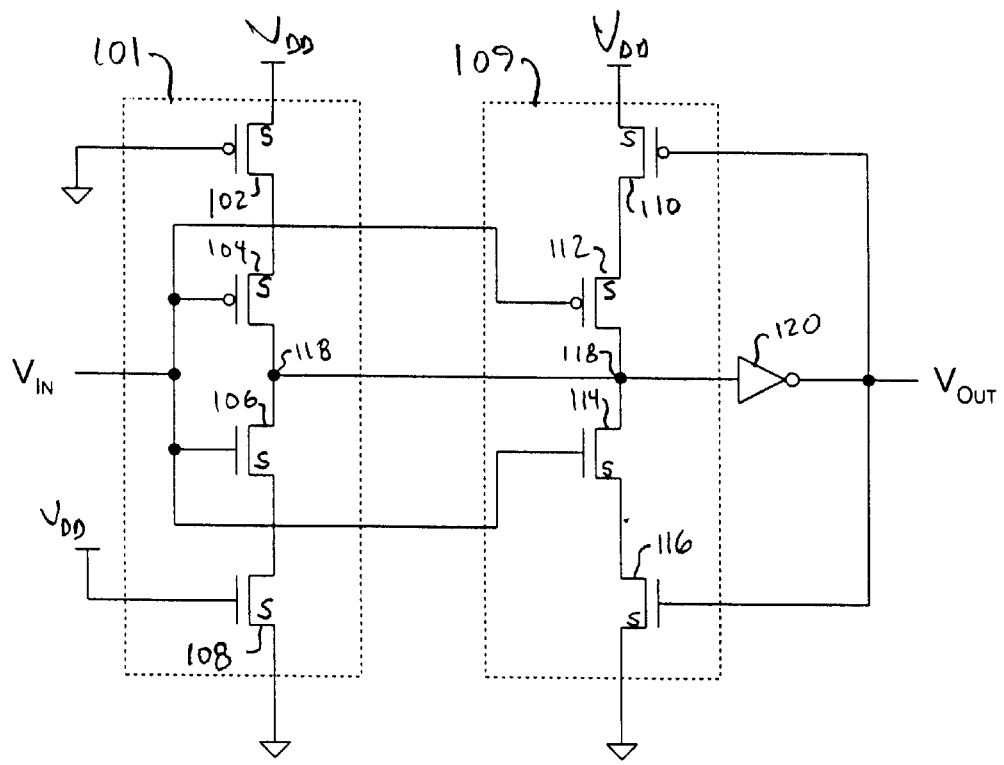
FIG. 1 is a schematic diagram of one embodiment of a level-detection circuit implementing the present invention.

FIG. 1 is a schematic diagram of one embodiment of a level-detection circuit 100 implementing the present invention. Generally stated, the circuit 100 receives an input signal $V_{IN}$ and provides an output voltage $V_{OUT}$. The circuit 100 has a first detection circuit 101 including P-type transistors 102 and 104, and N-type transistors 106 and 108. Each of those transistors (102, 104, 106, 108) are connected in series with the source of P-transistor 102 connected to the supply voltage, and the source of N-transistor 108 connected to the circuit ground. The gates of P-transistor 104 and N-transistor 106 are both tied to the input signal $V_{IN}$. The gate of P-transistor 102 may be tied low, and the gate of N-transistor 108 may be tied high so that the two transistors are always on. Alternatively, as described further below, the gates of N-transistor 108 and P-transistor 102 may be connected to receive an Enable signal and its complement, respectively, so that the circuit 100 may be powered down. In accordance with this embodiment of the invention, the strength of P-transistor 102 is much greater than the strength of P-transistor 104 so that the voltage drop across P-transistor 102 is very small and the source of P-transistor 104 is very close to the supply voltage $V_{DD}$. Similarly, the strength of N-transistor 108 is much greater than the strength of N-transistor 106 so that the voltage drop across N-transistor 108 is very small and the source of N-transistor 106 is very close to circuit ground. In this configuration, the source voltages of P-transistor 104 and N-transistor 106 are minimal and, advantageously, the body effect on them is also minimal.

The circuit 100 also has a trip-level adjustment circuit 109 including P-type transistors 110 and 112, and N-type transistors 114 and 116. Those transistors are also connected in series, with the source of P-transistor 110 connected to receive the supply voltage, and the source of N-transistor 116 connected to circuit ground. The gates of P-transistor 112 and N-transistor 114 are also tied together and to the input signal $V_{IN}$. In addition, the common drain junction of P-transistor 112 and N-transistor 114 is connected to the common drain junction of P-transistor 104 and N-transistor 106. That common drain junction 118 is also connected to the input lead of an inverter 120, which provides the output signal $V_{OUT}$. The output signal $V_{OUT}$ is then fed back to the gates of P-transistor 110 and N-transistor 116. In that way, the output signal $V_{OUT}$ operates to either turn on the P-transistor stack (110 and 112) via P-transistor 110, or the N-transistor stack (114 and 116) via the N-transistor 116. The components of the trip-level adjustment circuit 109 (e.g., transistors 110, 112, 114, 116) may be sized in a similar manner to their analogous components in the first detection circuit 101. Thus, similar to the first detection circuit 101, the voltage characteristics of the P-transistor pair (110 and 112) is dominated, principally, by P-transistor 112, and the voltage characteristics of the N-transistor pair (114 and 116) is dominated, principally, by the size of N-transistor 114.

In operation, the circuit 100 acts in this manner. As mentioned above, P-transistor 102 is always on and, thus, the voltage at the source of P-transistor 104 is roughly the same as the supply voltage $V_{DD}$. In addition, N-transistor 108 is always on so the voltage at the source of N-transistor 106 is roughly the circuit ground. When the input signal $V_{IN}$ is low, P-transistor 104 is on and N-transistor 106 is off, making the voltage at node 118 high. The voltage at node 118 is then inverted by inverter 120 making the output voltage $V_{OUT}$ low. The low output voltage is fed back to P-transistor 110, turning it on, and to N-transistor 116, turning it off. The input signal $V_{IN}$ is also provided to the gates of P-transistor 112 (turning it on) and N-transistor 114 (turning it off). Such is the steady state of the circuit when the input signal $V_{IN}$ is low.

As the input signal $V_{IN}$ transitions from low to high (0→1), the voltage at node 118 remains unchanged until the voltage at the gate of N-transistor 106 surpasses $V_T$ for that transistor. At that point, N-transistor 106 begins to turn on and begins to conduct current. In response, the voltage at node 118 begins to move away from the supply voltage $V_{DD}$. Inverter 120 may be selected to have a trip point at some potential such as roughly half way between the circuit ground (or any other low circuit potential) and the supply voltage $V_{DD}$. Therefore, as the voltage at node 118 continues to fall as the input signal $V_{IN}$ rises, it will eventually exceed the trip point of the inverter 120, and the output voltage $V_{OUT}$ will change state. However, the voltage at node 118 is influenced by the active transistors, e.g., P-transistor 104, P-transistor 112, and N-transistor 106 configured as an inverter with the P-transistors in parallel. That influence may be quantified by the ratio of the size of P-transistor 104 in parallel with P-transistor 112 to the size of single N-transistor 106. As mentioned above, the strength of P-transistor 102 is selected to be much greater than P-transistor 104. For that reason, the influence of P-transistor 102 on the trip level can be ignored (aside from its function as a switch) for the purpose of evaluating the circuit 100. For similar reasons, the influences of P-transistor 110 and N-transistor 108 on the trip level can be ignored. Thus, in the described embodiment, the trip level of the circuit 100 for the low to high transition (0→1) becomes a function of the ratio ($R^+$) of transistors given by the relationship:

$$R^+ = \frac{(W/L)_{M104} + (W/L)_{M112}}{(W/L)_{M106}}$$

Note that the sizes of both active P-type transistors (i.e., 104 and 112) impact the voltage at node 118. Therefore, the low-to-high trip level (V⁺) may be adjusted by properly sizing the components in the trip-level adjustment circuit 109 of the device while maintaining component sizes in the first detection circuit 101 that more closely resemble a standard inverter. In essence, the low-to-high trip level of the entire circuit 100 can be simulated as a circuit having a first inverter with ratio R⁺ followed by a second inverter like inverter 120. Thus, the designer is given more control over the particular point at which the output voltage $V_{OUT}$ will transition. For instance, the low to high trip level is more predictable because process variations that may impact the final sizing of the individual transistors are somewhat ameliorated when two of the same type of transistors are used to set the hysteresis (e.g., P-transistor 104 and P-transistor 112, or N-transistor 106 and N-transistor 114). In addition, the source of the dominant P-transistors in the circuit 100 are virtually at the supply voltage $V_{DD}$, thereby minimizing any back-bias and its effect on the transistor characteristics. Similarly, back-bias is minimized in the dominant N-transistors because their source potentials are virtually at the circuit ground. Moreover, because the similar-type transistors are each connected in the same way (e.g., for P-transistors 104 and 112, the gates are connected to the same node ($V_{IN}$), the drains are connected to the same node (118), and the sources are connected to virtually the same potential ($V_{DD}$)), they have the same operating point and circuit parameters effect both transistors in the same way making the effects less harmful. Accordingly, the present invention overcomes the conventional limitation related to the need to set the hysteresis of a circuit by modifying the on-resistance ratio of individual components having different operating points.

When the input signal $V_{IN}$ rises to the point that the voltage at node 118 overcomes the trip point of the inverter 120, the output voltage $V_{OUT}$ switches state from low potential to high potential. It will be appreciated that, due to the influence of the active transistors (e.g., 104, 112, and 106), the input signal $V_{IN}$ will at that point have surpassed the trip point of the first detection circuit 101 as it would be if unaltered by the trip-level adjustment circuit 109, thereby introducing a hysteresis effect in the low-to-high transition. When the output voltage $V_{OUT}$ changes state, that high potential is fed back to the gates of P-transistor 110 (turning it off) and N-transistor 116 (turning it on). As P-transistor 110 turns off, the influence of P-transistor 112 on node 118 diminishes, while the turning on of N-transistor 116 allows N-transistor 114 to begin to influence the voltage at node 118. At steady state, the input signal $V_{IN}$ has reached its high potential, P-transistor 104 and P-transistor 112 are turned off, N-transistor 106 and N-transistor 114 are turned on, and the output voltage $V_{OUT}$ is high.

Thus, when the circuit 100 is in the steady state with the input signal $V_{IN}$ high, the high potential of the output voltage $V_{OUT}$ at the gate of P-transistor 110 turns that transistor off, thereby removing the influence of P-transistor 112 on the voltage at node 118. Conversely, the high output voltage $V_{OUT}$ at the gate of N-transistor 116 turns that transistor on, thereby introducing the influence of N-transistor 114 on the voltage at node 118 in the high-to-low transition. Therefore, as the input signal $V_{IN}$ decreases, eventually the gate potential of P-transistor 104 falls below its threshold voltage and the P-transistor 104 begins to turn on. When current begins to flow through P-transistor 104, the voltage at node 118 begins to move from low to high. Again, similar to the low-to-high transition, the change in the current through P-transistor 104, and thus the change in voltage at node 118, is influenced by the ratio of the sizes of the active transistors, namely P-transistor 104 and the parallel combination of N-transistor 106 and N-transistor 114. That ratio (R⁻) may be described by the equation:

$$R^- = \frac{(W/L)_{M104}}{(W/L)_{M106} + (W/L)_{M114}}$$

Thus, the influence of the active transistors (e.g., 104, 106, and 114) causes the input signal $V_{IN}$ to fall to a level (V⁻) below the standard trip level ($V_{T101}$) of the first detection circuit 101 (as unaltered) before the state of the inverter 120 changes, thereby switching the state of the output voltage $V_{OUT}$ from high to low. Again, note that the influence of N-transistors 106 and 114 are added together to impact the voltage at node 118. In that way, the hysteresis introduced by the circuit 100 in the high-to-low direction may be adjusted by modifying the size of N-transistor 114 without altering the relationship of the ratio of P-transistor 104 to N-transistor 106. Additional improvement to the predictability of the hysteresis can be achieved by additional transistor matching. For instance by having the following transistor ratios:

$$\frac{(W/L)_{M104}}{(W/L)_{M102}} = \frac{(W/L)_{M112}}{(W/L)_{M110}} \quad \text{and:} \quad \frac{(W/L)_{M106}}{(W/L)_{M108}} = \frac{(W/L)_{M114}}{(W/L)_{M116}}$$

the ratio of the active transistor to the switching transistor in series is the same, and in that way, the source voltage of P-transistor 104 can be matched to P-transistor 112, and the source voltage of N-transistor 106 can be matched to N-transistor 114, thus making their operating points the same.

Figure 2:
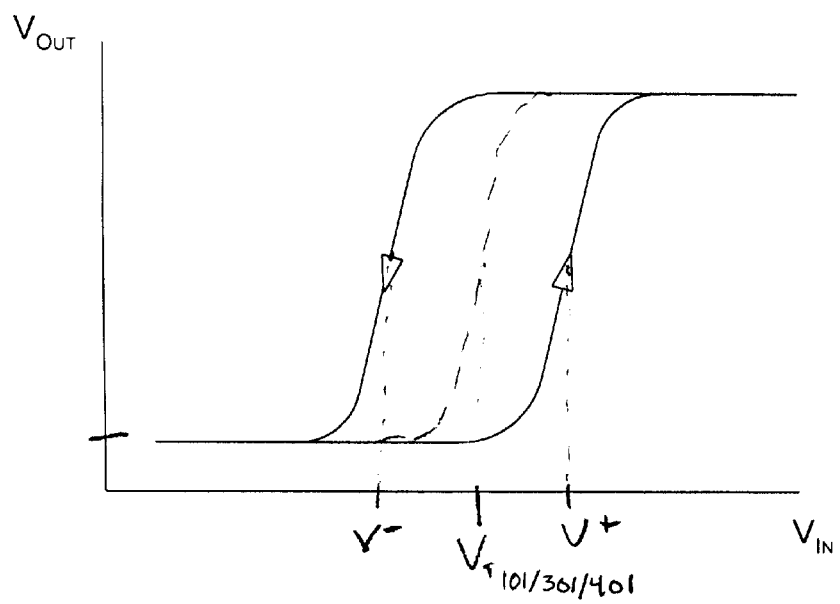
FIG. 2 is a voltage transfer characteristic diagram illustrating the output voltage as a function of the input voltage for the level-detection circuit illustrated in FIG. 1.

FIG. 2 is a Voltage Transfer Characteristic (VTC) graph illustrating the output voltage $V_{OUT}$ as a function of the input signal $V_{IN}$. Referring to the graph, it can generally be shown that as the input signal $V_{IN}$ increases from a low potential to a high potential, it passes through the unaltered trip level $V_{T101}$ of the first detection circuit 101 (as unaltered by the trip-level adjustment circuit 109). Due to the influence of the active transistors in the low-to-high transition (e.g. transistors 104, 106, and 112), the trip point of the circuit 100 is moved up to some higher voltage level V⁺. Likewise, as the input signal $V_{IN}$ decreases from a high potential to a low potential, it passes through the unaltered trip level $V_{T101}$ of the first detection circuit 101 until it overcomes the influence of the active transistors in the high-to-low direction (e.g., transistors 104, 106, and 114). In that way, the circuit 100 produces the desired hysteresis effect. And as discussed above, the amount of that hysteresis may be tailored by adjusting the sizes of either P-transistor 112 or N-transistor 114.

Figure 3:
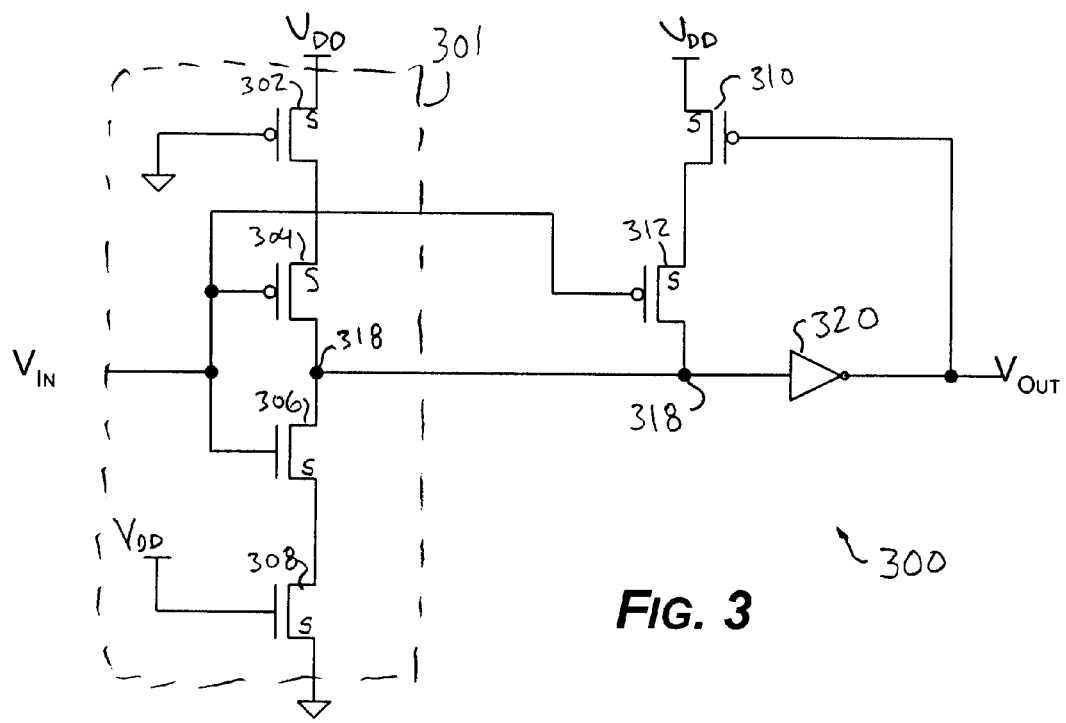
FIG. 3 is a schematic diagram of another embodiment of a level-detection circuit implementing the present invention.
Figure 4:
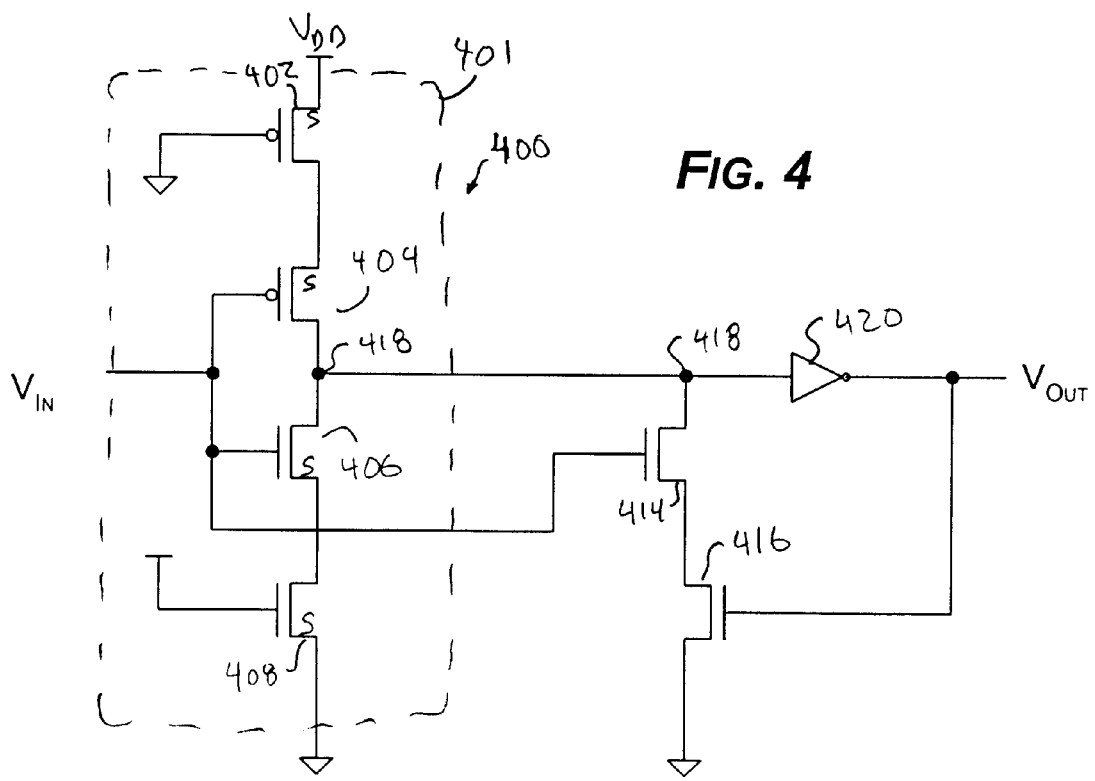
FIG. 4 is a schematic diagram of still another embodiment of a level-detection circuit implementing the present invention.

FIGS. 3 and 4 are schematic diagrams illustrating alternative circuits 300 and 400, respectively, that embody the principal of the invention. As suggested above, with the circuit 100 illustrated in FIG. 1, the low-to-high trip point (V⁺) is moved away from the trip point $V_{T101}$ of the first detection circuit 101 by the dominant influence of three transistors P-transistor 104, P-transistor 112, and N-transistor 106. However, if N-transistors 114 and 116 are omitted, the high-to-low trip point (V$^+$) becomes essentially the same as the unaltered trip point (V$_{T101}$) because in the high-to-low direction, only P-transistor 104 and N-transistor 106 influence the voltage at node 118. It will be appreciated, though, that hysteresis is still introduced in the circuit 100 because the falling trip point (V$^-$=V$_{T101}$) is still different from the rising trip point (V$^+$). And basically the same result may be achieved if P-transistors 110 and 112 are omitted instead of N-transistors 114 and 116. More specifically, if P-transistors 110 and 112 are omitted from the circuit 100 illustrated in FIG. 1, then the low-to-high trip point (V$^+$) becomes essentially the unaltered trip point (V$_{T101}$) of the first detection circuit 101, and the high-to-low trip point (V$^-$) is still influenced by N-transistor 114, thereby introducing hysteresis.

To that end, the circuit 300 illustrated in FIG. 3 represents essentially the same circuit as circuit 100, but that N-transistors 114 and 116 have been omitted. Therefore, with reference to the VTC illustrated in FIG. 2, for the circuit 300, as the input signal V$_{IN}$ moves from a low potential to a high potential, the influence of P-transistor 312 in parallel with P-transistor 304, and N-transistor 306 cause the voltage at node 318 to switch only after the input signal V$_{IN}$ has risen to a level (V$^+$) above the unaltered trip point of the first detection circuit 301 in the manner described above. Thus, the inverter 320 changes state when the input signal surpasses the trip level V$^+$ (FIG. 2). However, as the input signal V$_{IN}$ moves from a high potential to a low potential, P-transistor 310 is in cut-off, removing the influence of P-transistor 312 from the circuit 300. Thus, as the input signal V$_{IN}$ falls to the unaltered trip level (V$_{T301}$) of the first detection circuit 301, influenced only by the ratio of P-transistor 304 to N-transistor 306, the output voltage V$_{OUT}$ changes state. In this way, the trip level is different in the high-to-low direction (V$_{T301}$) than in the low-to-high direction (V$^+$), resulting in hysteresis.

Likewise, the circuit 400 in FIG. 4 represents essentially the same circuit as circuit 100, but that P-transistors 110 and 112 have been omitted. For that reason, as the input signal V$_{IN}$ moves from a low potential to a high potential, the influence of P-transistor 404 and N-transistor 406 are essentially balanced because N-transistor 416 is off, thereby essentially eliminating the influence of N-transistor 414. Thus, the inverter 420 changes state when the input signal V$_{IN}$ surpasses the unaltered trip level (V$_{T401}$) (FIG. 2) of the first detection circuit 401. However, as the input voltage moves from the high potential to the low potential, N-transistor 416 is on, allowing the contribution of N-transistor 414 to help influence the voltage at node 418 in parallel with N-transistor 406 in the manner described above. Thus, in the high-to-low direction, the input signal V$_{IN}$ moves to a voltage level (e.g., V$^-$) below the unaltered trip level of the first detection circuit 401 (e.g., V$_{T401}$) before the output voltage V$_{OUT}$ changes state. In that way, the trip level is different in the high-to-low direction (V$^-$) than in the low-to-high direction (V$_{401}$), resulting in hysteresis.

Figure 5:
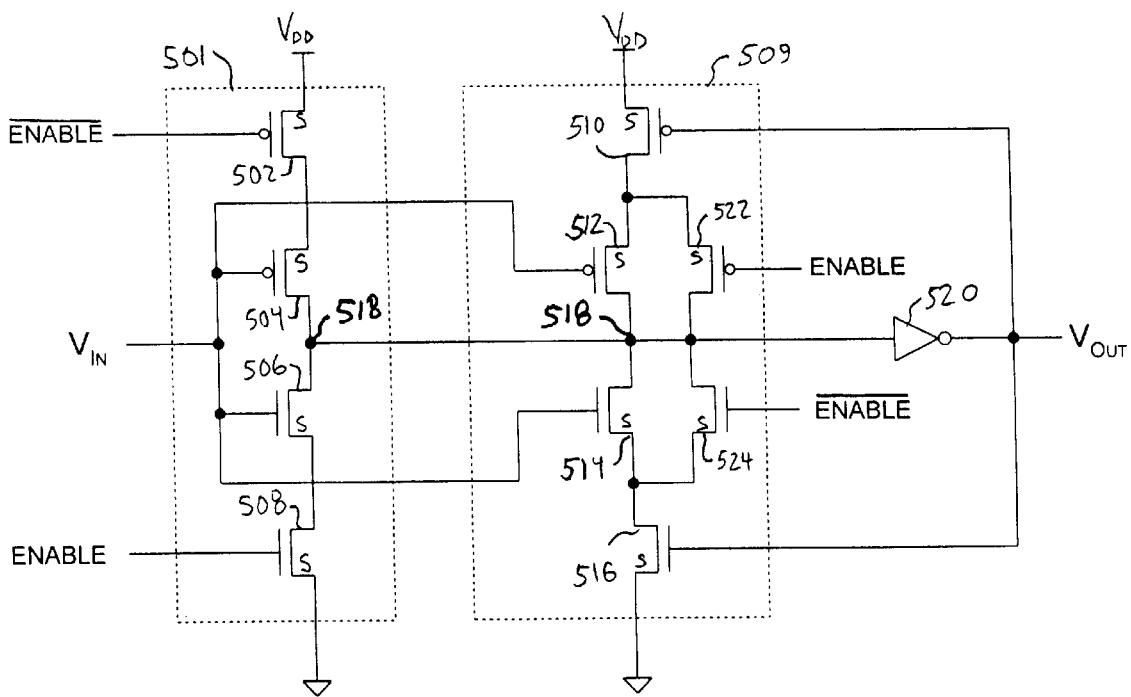
FIG. 5 is a schematic diagram illustrating yet another level-detection circuit based on the level-detection circuit illustrated in FIG. 1 and improved to include last-state memory.

FIG. 5 is a schematic diagram illustrating yet another circuit 500 that includes one embodiment of the invention. The circuit 500 is based on the circuit 100 illustrated in FIG. 1 and includes features directed at allowing the circuit 500 to be powered down, or for components in the circuit 500 to be disabled to consumes less power. It will be appreciated that many components of the circuit 500 are the same as those in the circuit 100 of FIG. 1. However, in the circuit 500, the high potential provided at the gate of N-transistor 508 is instead an Enable signal, and the low potential provided at the gate of P-transistor 502 is instead the complement signal $\overline{\text{Enable}}$. In addition, two new components, P-transistor 522 and N-transistor 524, are added in parallel with P-transistor 512 and N-transistor 514, respectively. The gate of P-transistor 522 is connected to receive the Enable signal, and the gate of N-transistor 524 is connected to receive the complement signal $\overline{\text{Enable}}$. Otherwise, the improved circuit 500 is similar to and performs like the circuit 100 illustrated in FIG. 1 and described above.

When the Enable signal is high and $\overline{\text{Enable}}$ is low, P-transistor 502 is on, N-transistor 508 is on, P-transistor 522 is off, and N-transistor 524 is off. In that state, the circuit 500 is essentially the same as the circuit 100 illustrated in FIG. 1 and performs similarly. But, when Enable goes low, and $\overline{\text{Enable}}$ goes high (indicating a power-down event), the Enable high signal at the gate of P-transistor 502 and the $\overline{\text{Enable}}$ low signal at the gate of N-transistor 508 turn those transistors off. In that state, the components of the first detection circuit 501 are disabled. The low Enable signal at the gate of P-transistor 522 and the high $\overline{\text{Enable}}$ signal at the gate of N-transistor 524 turn on those transistors as switches. In that state, P-transistor 510 in series with P-transistor 522, and N-transistor 516 in series with N-transistor 524 essentially form an inverter, which, together with inverter 520, acts to latch the last state of the circuit 500. With P-transistor 522 on and N-transistor 524 on, feedback is applied to node 518 to form a latch no matter what state the input signal V$_{In}$ is in, so that it does not matter if P-transistor 512 is on or off, or N-transistor 514 is on or off. In that way, although the circuit 500 is disabled, the last state that it was in will be the state that it is in when it is re-enabled, thus providing last-state memory.

The above specification, examples and data provide a complete description of the manufacture and use of the invention. Since many embodiments can be made without departing from the spirit and scope of the invention, the invention resides in the claims hereinafter appended.

I claim:

1. An apparatus for generating an output signal based on an input signal, comprising:

a first detection circuit configured to detect a potential of the input signal and that provides an intermediate output signal having a level based on the potential of the input signal, the first detection circuit having an unaltered threshold potential at which the first detection circuit changes a state of the intermediate output signal, the first detection circuit being coupled to receive an enable signal, the first detection circuit being further configured to be deactivated in response to the enable signal being deasserted;

a second detection circuit coupled to the intermediate output signal and being configured to change a state of the output signal in response to the level of the intermediate output signal changing state; and a trip-level adjustment circuit coupled to the first detection circuit and configured to influence the first detection circuit such that the intermediate output signal changes state when the input signal is at some potential different from the unaltered threshold potential, the trip-level adjustment circuit comprising a first subcircuit having a first control mechanism coupled to the output signal of the second detection circuit and a first influence control mechanism under control of the input signal;

wherein the first control mechanism is sized sufficiently large in comparison to the first influence control mechanism such that a voltage drop across the first control mechanism is much less than a voltage drop across the first influence control mechanism.

2. The apparatus of claim 1 wherein the first detection circuit comprises a first subcircuit and a second subcircuit configured as an inverter.

3. The apparatus of claim 2 wherein the first subcircuit includes a pair of transistors in series and the second subcircuit includes another pair of transistors in series.

4. The apparatus of claim 1 wherein the first subcircuit is coupled to receive a reference potential and to receive the intermediate output signal, the first control mechanism being coupled to the output signal of the second detection circuit such that when the output signal is in a first state the first subcircuit is active and when the output signal is in a second state the first subcircuit is deactivated, the first subcircuit being operative to provide feedback, when activated, to the first detection circuit as the input signal changes from a first potential to a second potential.

5. The apparatus of claim 4 wherein the first subcircuit further comprises a second control mechanism coupled to the input signal, the feedback of the first subcircuit being under control of the second control mechanism.

6. The apparatus of claim 5 wherein the first control mechanism comprises a transistor and the second control mechanism comprises another transistor.

7. The apparatus of claim 4 wherein the trip-level adjustment circuit comprises a second subcircuit coupled to another reference potential and to the intermediate output signal, the second subcircuit including a second control mechanism coupled to the output signal of the second detection circuit such that when the output signal is in the first state the second subcircuit is inactive and when the output signal is in the second state the second subcircuit is active, the second subcircuit being operative to provide feedback, when activated, to the first detection circuit as the input signal changes from the second potential to the first potential.

8. The apparatus of claim 7 wherein the first influence control mechanism is connected between the first control mechanism and the intermediate output signal, and further wherein the second subcircuit further includes a second influence control mechanism under control of the input signal, the second influence control mechanism being connected between the second control mechanism and the intermediate output signal.

9. The apparatus of claim 8 wherein the second control mechanism is sized sufficiently large in comparison to the second influence control mechanism such that a voltage drop across the second control mechanism is much less than a voltage drop across the second influence control mechanism.

10. An apparatus for generating an output signal based on an input signal, comprising:
a first detection circuit, coupled to receive the input signal, that detects a potential of the input signal and that provides an intermediate output signal having a level based on the potential of the input signal, the first detection circuit having an unaltered threshold potential at which the first detection circuit changes a state of the intermediate output signal, the first detection circuit being coupled to receive an enable signal, the first detection circuit being further configured to be deactivated in response to the enable signal being deasserted;
a second detection circuit coupled to receive the intermediate output signal and being configured to change a state of the output signal in response to the level of the intermediate output signal passing through a second threshold potential;
a trip-level adjustment circuit configured to influence the first detection circuit such that the intermediate output signal passes through the second threshold potential while the input signal is at some potential different from the unaltered threshold potential of the first detection circuit; and
a latching circuit coupled to receive the intermediate output signal and to receive the enable signal, the latching circuit being configured to latch a state of the intermediate output signal in response to the enable signal being deasserted.

11. The apparatus of claim 10 wherein the trip-level adjustment circuit comprises a first subcircuit coupled to receive a reference potential signal and to receive the intermediate output signal, the first subcircuit including a first control mechanism coupled to receive the output signal of the second detection circuit such that when the output signal is in a first state the first subcircuit is activated and when the output signal is in a second state the first subcircuit is deactivated, the first subcircuit further comprising a second control mechanism coupled to receive the input signal and configured to provide feedback to the first detection circuit, when the first subcircuit is activated, as the level of the intermediate output signal changes from a first potential to a second potential.

12. The apparatus of claim 11 wherein the first control mechanism comprises a transistor and the second control mechanism comprises another transistor.

13. The apparatus of claim 11 wherein the trip-level adjustment circuit comprises a second subcircuit coupled to receive another reference potential and to receive the intermediate output signal, the second subcircuit including a third control mechanism coupled to receive the output signal of the second detection circuit such that when the output signal is in the first state the second subcircuit is deactivated and when the output signal is in the second state the second subcircuit is activated, the second subcircuit further comprising a fourth control mechanism coupled to the input signal and configured to provide feedback to the first detection circuit, when the second component is activated, as the intermediate output signal changes from the second potential to the first potential.

14. The apparatus of claim 13 wherein the latching circuit comprises:
a first latching element under control of the enable signal, coupled to the first subcircuit, and being configured to latch a state of the first subcircuit in response to the enable signal being deasserted; and
a second latching element under control of the enable signal, coupled to the second subcircuit, and being configured to latch a state of the second subcircuit in response to the enable signal being deasserted.

15. The apparatus of claim 14 wherein the first latching element comprises a transistor, and the second latching element comprises another transistor.

16. The apparatus of claim 14 wherein the latching circuit further comprises a first latching circuit switch coupled to the first detection circuit and under control of the enable signal, wherein the first latching switch deactivates at least a portion of the first detection circuit in response to the enable signal being deasserted.

17. The apparatus of claim 16 wherein the latching circuit further comprises a second latching circuit switch coupled to the first detection circuit and under control of the enable signal, wherein the first latching switch deactivates at least another portion of the first detection circuit in response to the enable signal being deasserted.

18. The apparatus of claim 17 wherein the first detection circuit comprises a first detection transistor connected in series with a second detection transistor, and wherein the first latching circuit switch is coupled to the first detection transistor such that the first latching circuit switch deactivates the first detection transistor when the enable signal is deasserted, and wherein the second latching circuit switch is coupled to the second detection transistor such that the second latching circuit switch deactivates the second detection transistor when the enable signal is deasserted.

19. The apparatus of claim 18 wherein the first latching circuit switch comprises a transistor, and the second latching circuit switch comprises another transistor.

20. A method for powering down a circuit that generates an output signal based on an input signal, comprising:

receiving an input signal at a level-detection circuit;

generating an intermediate output signal by the level-detection circuit based on the input signal;

receiving the input signal at a trip-level adjustment circuit;

influencing the level-detection circuit by the trip-level adjustment circuit such that a level of the intermediate output signal reaches a trip-level of an output inverter when the input signal is at a potential different from an unaltered threshold potential of the level-detection circuit, the influence being based upon a component in the trip-level adjustment circuit in combination with a component in the level-detection circuit;

receiving an enable signal indicating a power-down event, the intermediate output signal having a last state at the occurrence of the power-down event; and latching the last state of the intermediate output signal such that when a power-up event occurs, the intermediate output signal is at the last state.

21. The apparatus of claim 8, wherein the reference potential of the first subcircuit comprises a supply voltage and the other reference potential of the second subcircuit comprises a circuit ground.

* * * * *